(12) United States Patent
Augustine et al.

(10) Patent No.: US 7,420,226 B2
(45) Date of Patent: Sep. 2, 2008

(54) METHOD FOR INTEGRATING SILICON CMOS AND ALGAN/GAN WIDEBAND AMPLIFIERS ON ENGINEERED SUBSTRATES

(75) Inventors: Godfrey Augustine, Laurel, MD (US); Deborah Partlow, Crownsville, MD (US); Alfred Paul Turley, Ellicot City, MD (US); Thomas Knight, Silver Spring, MD (US); Jeffrey D. Hartman, Severn, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 186 days.

(21) Appl. No.: 11/326,443

(22) Filed: Jan. 6, 2006

(65) Prior Publication Data
US 2006/0284247 A1   Dec. 21, 2006

Related U.S. Application Data

(60) Provisional application No. 60/691,230, filed on Jun. 17, 2005.

(51) Int. Cl.
*H01L 29/34* (2006.01)
(52) U.S. Cl. .................. 257/195; 257/201; 438/172; 438/606
(58) Field of Classification Search .............. 257/194, 257/195, 201; 438/167, 172, 604, 606
See application file for complete search history.

(56) References Cited

U.S. PATENT DOCUMENTS

| 6,194,290 | B1 | 2/2001 | Kub et al. | |
|---|---|---|---|---|
| 6,242,324 | B1 | 6/2001 | Kub et al. | |
| 6,328,796 | B1 | 12/2001 | Kub et al. | |
| 6,462,360 | B1 * | 10/2002 | Higgins et al. | 257/189 |
| 6,497,763 | B2 | 12/2002 | Kub et al. | |
| 6,531,740 | B2 * | 3/2003 | Bosco et al. | 257/347 |
| 6,646,293 | B2 * | 11/2003 | Emrick et al. | 257/194 |
| 6,784,466 | B2 * | 8/2004 | Chu et al. | 257/194 |
| 6,914,273 | B2 * | 7/2005 | Ren et al. | 257/194 |
| 7,012,274 | B2 * | 3/2006 | Taylor | 257/12 |
| 2002/0031877 | A1 * | 3/2002 | Arai | 438/167 |
| 2003/0013284 | A1 | 1/2003 | Emrick et al. | |
| 2003/0015730 | A1 * | 1/2003 | Bosco et al. | 257/195 |
| 2003/0034506 | A1 * | 2/2003 | Pandya et al. | 257/201 |
| 2003/0129780 | A1 | 7/2003 | Auberton-Herve | |
| 2004/0084720 | A1 | 5/2004 | Esser et al. | |
| 2007/0138506 | A1 * | 6/2007 | Braddock | 257/192 |

FOREIGN PATENT DOCUMENTS

WO   WO-01/06546 A2   1/2001

OTHER PUBLICATIONS

"Sensors and Actuators A", J. Du et al., 112 (2004), pp. 116-121.
(Continued)

*Primary Examiner*—Fernando L Toledo
(74) *Attorney, Agent, or Firm*—Andrews Kurth LLP

(57) ABSTRACT

High-speed silicon CMOS circuits and high-power AlGaN/GaN amplifiers are integrated on the same wafer. A thin layer of high resistivity silicon is bonded on a substrate. Following the bonding, an AlGaN/GaN structure is grown over the bonded silicon layer. A silicon nitride or a silicon oxide layer is then deposited over the AlGaN/GaN structure. Following this, a thin layer of silicon is bonded to the silicon nitride/silicon oxide layer. An area for the fabrication of AlGaN/GaN devices is defined, and the silicon is etched away from those areas. Following this, CMOS devices are fabricated on the silicon layer and AlGaN/GaN devices fabricated on the AlGaN/GaN surface.

20 Claims, 12 Drawing Sheets

OTHER PUBLICATIONS

"J. Electronic Materials", G. Kipshidze et al, vol. 30, No. 7 (2001) p. 825.

"Semiconductor Manufacturing Technology", Prentice Hall (2001), Chapter 12: Metallization.

"Single Crystal SiC MEMS Fabrication Technology Using Smart-Cut Process for Harsh Environment Application", EECS Department, Case Western Reserve University, 5 pages.

* cited by examiner

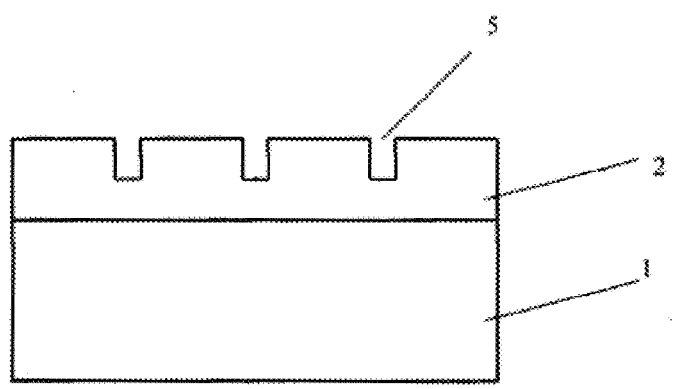
*Fig. 4*
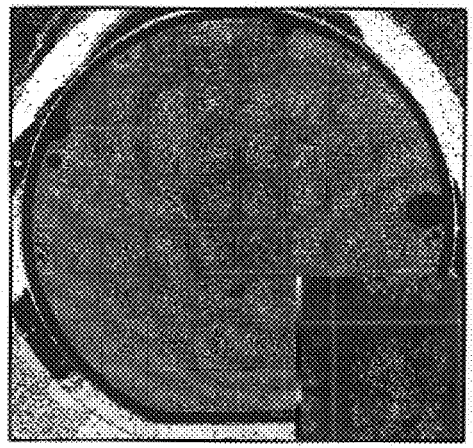 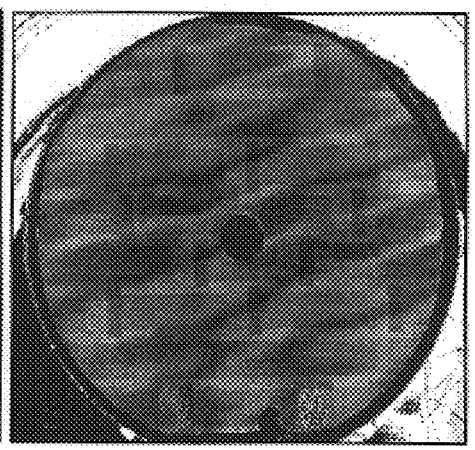
*Fig. 5a*   *Fig. 5b*

Step 1

<111> Silicon layer bonded to poly-SiC

Step 2

Grow AlGaN/GaN device layers on the silicon film

Step 3

Encapsulate GaN device layer with deposited silicon passivation layer

Step 4

Attach silicon layer to passivation film surface through a wafer bonding process Form polysilicon SOI CMOS structures Step 7

Form AlGan/GaN MMIC (Source-Gate-Drain)

Step 8

Deposit insulator and planarize

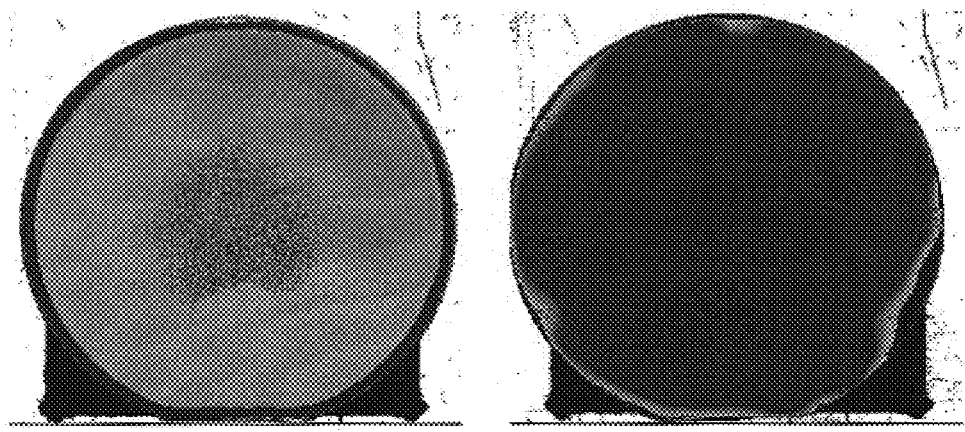
*Fig. 16a*  *Fig. 16b*
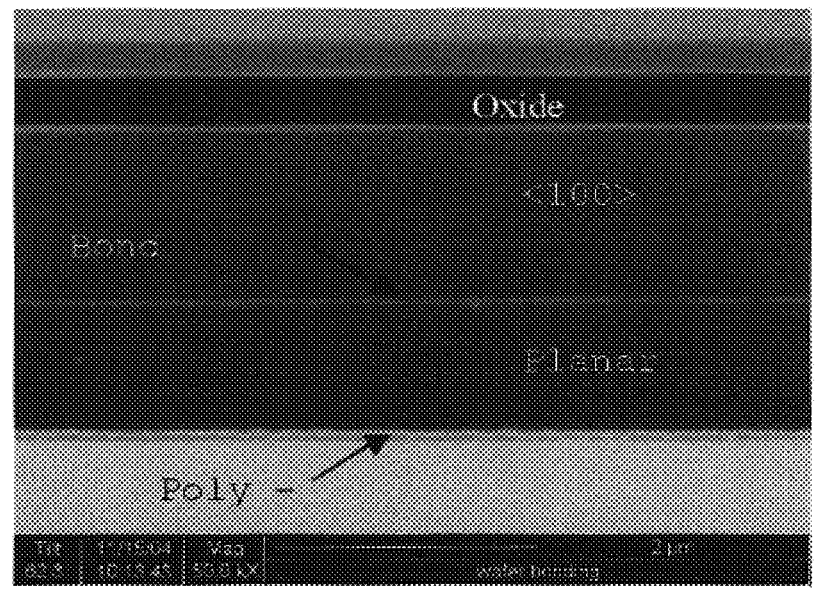
*Fig. 17*

METHOD FOR INTEGRATING SILICON CMOS AND ALGAN/GAN WIDEBAND AMPLIFIERS ON ENGINEERED SUBSTRATES

This application claims priority under 35 U.S.C. § 119 of provisional application No. 60/691,230, filed Jun. 17, 2005, the entire contents of which are hereby incorporated by reference.

BACKGROUND OF THE INVENTION

1. Field of the Invention

A CMOS transistor and an AlGaN/GaN amplifier are formed on the same substrate, where the substrate has high thermal efficiency.

2. Description of the Related Art

Gallium nitride (GaN) is a wide-bandgap semiconductor material that has potential applications in high-speed, high power transistor devices. One of the main drawbacks to the production of these devices is the limited availability of suitable substrates for epitaxial growth. A high-quality bulk single crystal substrate at low cost that has a large area is desirable for the growth of gallium nitride epitaxial layers for device fabrication. In one example of the related art technology, the GaN epitaxial layer would be grown homoepitaxially on a single crystal GaN substrate. However, the cost and availability of these wafers are prohibitive.

Currently, GaN films are produced by heteroepitaxial growth on either single crystal silicon carbide (SiC) or sapphire. Due to the lattice mismatch between GaN (4.8 Å) and sapphire (4.763 Å) or 4H-silicon carbide (3.0730 Å), a significant number of threading dislocations on the order of $10^8$ are formed during the growth process.

Another substrate of interest is single crystal silicon, which is readily available in sizes up to 12 inches in diameter. However, silicon does not have the thermal dissipation properties that are necessary for high power, high-speed devices. In addition, Si and GaN have a significant thermal expansion mismatch. One potential method to reduce the cost and improve the properties of the substrates is to manufacture the devices on a polycrystalline substrate utilizing three-dimensional integration through wafer bonding.

Wafer bonding allows heterogeneous substrates to be bonded together at temperatures as low as 200° C. Low temperature bonding is important to minimize chemical reactions of the metals and stresses that arise due to thermal coefficient of expansion mismatches. Wafer bonding occurs when wafers with atomically smooth surfaces are brought into contact and initially adhere due to hydrogen bonding, which is a result of the reaction between water molecules and hydroxyl groups present on the wafer surfaces. Subsequent anneals either transport the water away from the interface or cause the water to react and produce a siloxane bond across the interface.

The siloxane bond, Si—O—Si, is a covalent bond. In the case of silicon-to-silicon bonding, where no siloxane bond is desired, high temperature anneals will cause the oxygen to diffuse away from the interface, resulting in Si—Si covalent bonding.

A conventional approach to forming a multi-layered substrate is typified by the work F. J. Kub et al. (U.S. Pat. Nos. 6,328,796 and 6,497,763). This related art technology forms a composite substrate that includes polycrystalline layers, amorphous layers and single crystal layers. However, the conventional technology requires an oxide bonding layer in order to have monocrystalline silicon bond to polycrystalline substrate structure. Alternately, the conventional art used carbonization (which can produce impurities) to promote adhesion.

Also, related art technology necessitates that when forming devices that combine high speed silicon switching circuits with high power AlGaN/GaN amplifier circuits, these two different types of circuits be formed on different chips. Then the chips are formed into a circuit using such techniques as wire bonding. However, this approach is inefficient and results in yield loss arising from the extra manufacturing steps required to manufacture two chips and wire them together.

Accordingly, the development of high power semiconductor devices requires new and low cost substrates having both good thermal conductivity and superior electrical properties. Additionally, new engineered substrates are needed that can accommodate circuit technologies based on different material types such as Si and ALGaN/GaN.

SUMMARY OF THE INVENTION

Accordingly, one aspect of the present invention produces a multi-layered substrate that substantially obviates one or more problems due to limitations and disadvantages of the related art.

An aspect of the invention is to provide a bonding process in which a single crystal silicon layer is transferred from a silicon-on-insulator (SOI) wafer to a polycrystalline silicon carbide substrate by creating a Si—Si bond.

One aspect of the technology pertains to a semiconductor device that includes a substrate having a polished surface, a planarization layer formed over the polished surface of the substrate, and a single crystalline layer formed over the planarization layer.

Also, polished surface can optionally have a root-mean-square surface roughness of 10 nm or less, preferably 5 nm or less. Trenches can optionally be formed in at least one of the planarization layer and the single crystalline layer, and the trenches can have a pitch up to 2000 μm apart, preferably about 1500-1700 μm. The substrate can be an amorphous, a single crystalline or a polycrystalline material selected from SiC, graphite, diamond, ZnSe, AlN, BN, GaN or mixtures thereof. Preferably, the substrate can be polycrystalline SiC, the planarization layer can be amorphous Si, and the single crystalline layer comprises single crystalline Si. Also, an epitaxial layer can be formed over the single crystalline layer.

Another aspect of the technology pertains to manufacturing a semiconductor device that includes providing a substrate, polishing a surface of the substrate, forming a planarization layer over the surface of the substrate, and bonding a single crystalline layer to the planarization layer. At least one may optionally be formed in at least one of the planarization layer or the single crystalline layer, before the step of bonding the single crystalline layer to the planarization layer.

Other aspects include polishing that can optionally be performed using mechanical or chemical-mechanical-planarization (CMP). Also, the bonding of the single crystalline layer to the planarization layer can be performed by contacting the single crystalline layer to the planarization layer under a vacuum at a temperature of about 25 to 50° C., preferably 25 to 35° C. The method can also include annealing at a temperature at up to about 700° C., after the step of bonding the planarization layer to the single crystalline layer.

An aspect of the invention integrates silicon CMOS and ALGaN/GaN wideband amplifiers on engineered substrates.

The technology, in part, pertains to a semiconductor device formed from a substrate, the substrate having a single crystalline layer; an AlGaN/GaN layer formed over the single crystalline layer; a passivation layer formed over the AlGaN/GaN layer; a CMOS region having at least one single crystalline island formed over the passivation layer; at least one FET formed over at the least one single crystalline island; and an amplifier region having at least one AlGaN/GaN transistor.

The single crystalline layer may preferably be <111> silicon, and each single crystalline island may preferably be <100> silicon. The passivation layer may be a nitride, an oxide or an organic material. Further, the FET(s) and the AlGaN/GaN transistors may be connected with metal interconnects and plugs, where the interconnects may be formed form aluminum, aluminum-copper alloys, or copper, and the plugs may be formed from tungsten. The AlGaN/GaN transistor(s) may be a monolithic microwave integrated circuit.

The technology, in part, pertains to a method for manufacturing a semiconductor device that includes providing a substrate, the substrate having a single crystalline layer; forming an AlGaN/GaN layer over the single crystalline layer; forming a passivation layer formed over the AlGaN/GaN layer; forming a CMOS region having at least one single crystalline island over the passivation layer; forming a at least one FET over at least one single crystalline island; and forming an amplifier region having at least one AlGaN/GaN transistor.

Additional features and advantages of the invention will be set forth in the description which follows, and in part will be apparent from the description, or may be learned by practice of the invention. The objectives and other advantages of the invention will be realized and attained by the structures particularly pointed out in the written description and claims hereof as well as the appended drawings.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIG. 4 shows trenches that have been formed in an upper surface of the planarization layer.

FIG. 5a shows a sonoscan showing the initial effect of trenches and an exclusion zone), according to an exemplary embodiment of the invention;

FIG. 5b shows a bonded substrate with trenches spaced about 1500 to 1700 μm apart), according to an exemplary embodiment of the invention;

FIG. 16a shows an acoustic microscope sonoscan image of an example of a bulk wafer bonded to polycrystalline SiC prior to thinning, according to an embodiment of the invention;

FIG. 16b shows an acoustic microscope sonoscan image of an example of a silicon on insulator (SOI) wafer bonded to a polycrystalline silicon carbide substrate, according to an embodiment of the invention; and FIG. 17 shows a cross-section of the wafer pair shown in FIG. 7b.

DETAILED DESCRIPTION

Reference will now be made in detail to the preferred embodiments of the invention, examples of which are illustrated in the accompanying drawings.

A multi-layer semiconductor utilizes the good thermal and electrical properties of a polycrystalline substrate with the electrical properties of single crystal film transferred via wafer bonding. The structure includes a polycrystalline substrate, e.g., silicon carbide substrate, which was polished. A planarization layer of silicon (Si), silicon nitride (SiN) or silicon dioxide ($SiO_2$) is applied to the surface using sputtering, CVD or any other appropriate method, followed by polishing. The substrate is bonded to either a bulk silicon wafer or a silicon-on-insulator (SOI) wafer. The silicon (SOI) wafer is thinned to the desired thickness.

A multilayered device structure utilizes a novel bonding process, which results in the transfer of a single crystal silicon layer for subsequent epitaxial growth and/or device fabrication. A substrate that may be chosen for this application is polycrystalline silicon carbide, but may also include single crystal or polycrystalline AlN, GaN, SiC, ZnSe, graphite, diamond, BN or mixtures thereof. Polycrystalline SiC was chosen as the preferred substrate material due to its superior thermal dissipation properties and low cost.

Figure 1:
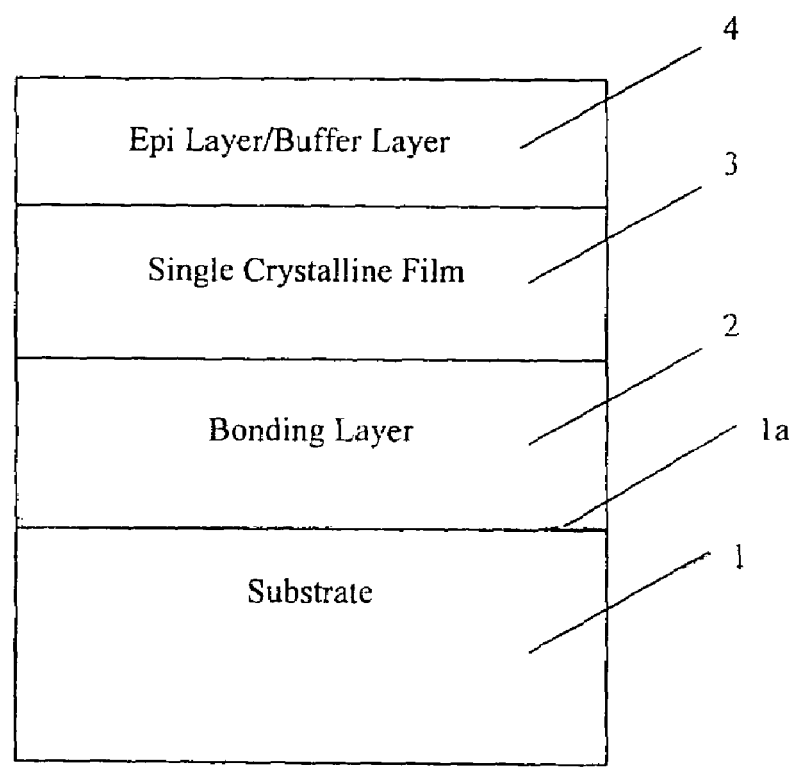
FIG. 1 shows a multi-layered device formed according to an embodiment of the invention.

FIG. 1 shows a general cross-section of the multi-layered device in accordance with a preferred embodiment of the invention. The multi-layered structure includes an amorphous, monocrystalline or polycrystalline substrate 1. The substrate 1 may be formed from SiC or any other suitable material such as AlN, ZnSe, GaN, graphite, diamond and BN. The substrate 1 may have a thickness of from 100 to 700 µm, preferably 400 to 600 µm. If contact printing is used, the substrate 1 can have a thickness of up to about 1500 µm.

Over a surface 1a of the substrate 1 is formed a planarization (bonding) layer 2, which can typically be of sputtered amorphous or polycrystalline silicon. The planarization layer 2 may also be formed from an amorphous or polycrystalline material such as a nitride, an oxide or benzocyclobutene (BCB). The planarization layer 2 may have a thickness of 1 to 4 µm before polishing with CMP, and may have a thickness of about 0.5 µm to 2 µm after polishing with CMP.

Over the planarization layer 2 is formed a single crystalline layer 3 of silicon or any other suitable single crystalline material. The single crystalline film can have a thickness of 1000 Å to 2 µm, preferably in the range of 1000 Å to 5000 Å. Typically, the single crystalline film 3 has a thickness of about 2000 Å. Finally, the desired epitaxial and/or buffer layers 4 are deposited over the single crystalline film 3. The epitaxial/buffer layer 4 can have a thickness of from 0.5 µm to 3 µm. In this range, the thickness of the epitaxial/buffer layer 4 will be thinner if it is formed by molecular beam epitaxy (MBE), and it will be thicker if formed by metal organic chemical vapor deposition (MOCVD).

One of the advantages of the invention resides in that no adhesion promoting oxide layer is required between the planarization layer 2 and the single crystalline layer 3. Oxide layers have poor thermal conductivity. If an oxide layer is present, then the thermal efficiency of the semiconductor device is reduced. As a result, Si and SiN are preferred materials.

Figure 2:
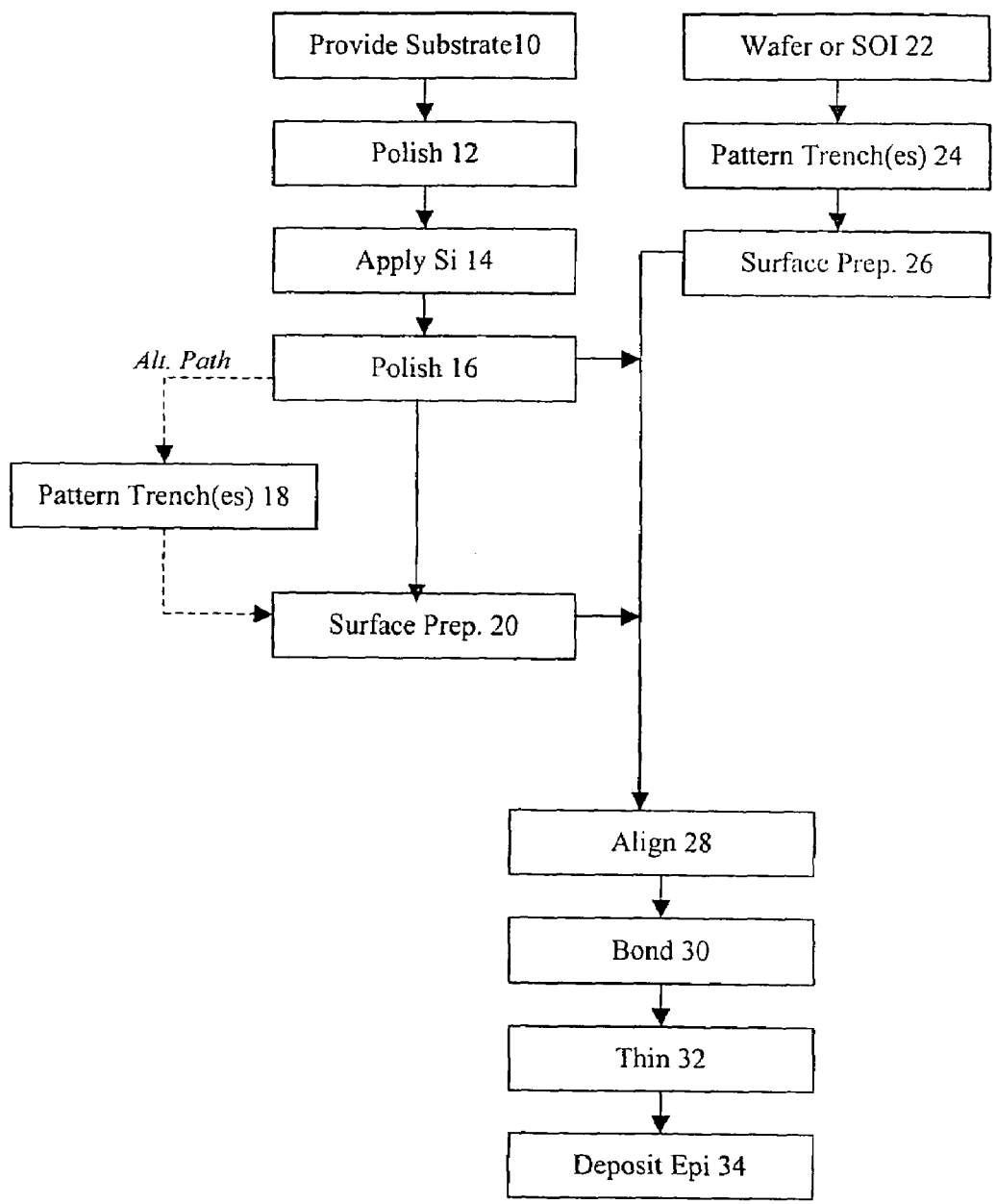
FIG. 2 shows a flow diagram for a process to form a multilayered device according to an embodiment of the invention.

A process to obtain the multi-layer device is shown schematically in FIG. 2. The initial step 10 entails providing a substrate (for example, made from polycrystalline SiC) that may be polished in a polishing step 12 to a root-mean-square (RMS) roughness of 10 nm or less, preferably 5 nm or less. Then, the polished substrate is used as support for forming a planarization layer in a planarization step 14, which may be accomplished by sputtering Si. Other methods for forming the planarization layer may also be used, including chemical vapor deposition (CVD). Appropriate CVD methods may include atmospheric pressure CVD (APCVD), sub-atmospheric CVD (SACVD), low pressure CVD (LPCVD), plasma enhanced CVD (PECVD), high-density plasma CVD (HDPCVD), metal organic CVD (MOCVD) and vapor phase epitaxy (VPE). Afterwards, a polishing step 16 may performed using any appropriate polishing method such as mechanical polishing or chemical mechanical planarization (CMP) 16. After the polishing step 16, an optional patterning step 18 may be used to form trenches in the planarization layer. A surface preparation step 20 cleans and prepares the planarized substrate for bonding with the single crystalline layer.

FIG. 2 also shows the preparation of the single crystalline layer, which includes providing a single crystalline structure 22 (which may be bulk silicon, silicon on insulator (SOI), or any other appropriate material). Optionally a patterning step 24 may be used to form trenches in the single crystalline layer. Then, a surface preparation step 26 may be used to clean and condition the single crystalline layer prior to bonding to the planarization layer. The bonding is performed by first performing a step of aligning the two halves of the semiconductor structure 28, followed by a step of bonding 30, typically by pressing the two halves of semiconductor together inside of a vacuum chamber. A typical pressing force is in the range of 300-400 lb over a 4 inch wafer, but any appropriate pressing force may be used. Then, the single crystalline layer may be thinned 32 prior to the subsequent steps of depositing epitaxial layers 34 to form the working semiconductor device. However, the thinning step may be omitted if there is an application may utilize the bulk single crystalline layer.

The surface 1a of the substrate 1 (which may be polycrystalline silicon carbide) is polished and planarized, resulting in a surface roughness of less than about 10 nm, preferably less than about 5 nm. The root-mean-square (RMS) roughness value of the surface 1a may be considerably high, 3 nm for a 2 µm square scan, for direct wafer bonding. Even a 5 nm RMS can be used. In a preferred embodiment of the invention, an RMS roughness value of less than about 5 Å is desirable. Currently, RMS values below the range of about 1-2 Å are difficult to obtain, but preferably an RMS roughness approaching 0 Å, i.e., 0.1 Å would be used.

Polishing can be performed using various methods. For example, a diamond based mechanical polish can be used. Chemical mechanical planarization (CMP) may be performed using slurries of ceria, mixed rare earth metal oxides or alumina. The mean particle size of the slurries should preferably be 100 nm or less. In CMP, the wafer is positioned in a wafer holder or carrier, and held against a polishing pad on a flat surface known as a platen. The motion between the wafer and the polishing pad may be controlled using either orbital or rotary motion.

Figure 3:
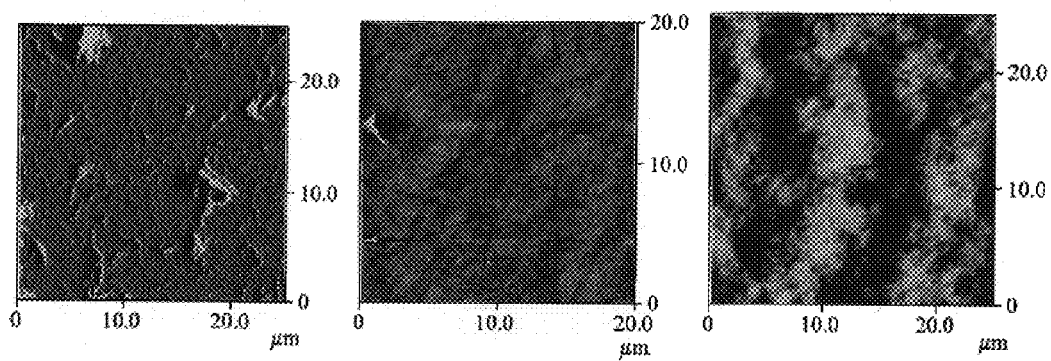
FIG. 3a is an atomic force microscopy (AFM) photomicrograph of an SiC wafer prior to polishing, according to an exemplary embodiment of the invention.
FIG. 3b is a photomicrograph of an SiC wafer after polishing, according to an exemplary embodiment of the invention.
FIG. 3c shows a an SiC wafer coated with Si after chemical mechanical polishing (CMP), according to an exemplary embodiment of the invention.

FIGS. 3a and 3b show atomic force microscope images of the polycrystalline silicon carbide substrates before and after polishing. Polishing the substrate eliminates the growth of a polycrystalline layer of the substrate material (which can be SiC, graphite, diamond, AlN, ZnSe, BN, and mixtures thereof) that was observed in the related art technologies. As a result, the need to utilize an oxide adhesion layer is eliminated.

Then, a planarization layer 2 (preferably formed from Si, but other materials can be used, including SiN and $SiO_2$) is deposited over the surface 1a of the substrate 1 after it has been polished. However, the material of the planarization layer is not restricted to silicon, and any appropriate material can be used. Between 1 and 4 µm thick films of silicon may be deposited onto the silicon carbide surface using any appropriate method such as sputtering or CVD. However, these thicknesses can be reduced. The film is then polished using CMP or mechanical polishing. After polishing, the thickness can range from about 0.5 µm to 2 µm.

FIG. 3c shows an example of the surface roughness (RMS) of the substrate 1 after polishing, which is on the order of 7 Å. Although the RMS roughness value is still slightly greater than the preferred 5 Å, the results demonstrate a process that will improve with lower roughness values.

Adhesion problems arise when bonding wafers according to the conventional art technology. That is, although good adhesion is frequently observed near wafer edges, insufficient outgassing of impurities often results in poor adhesion at the interior of the wafer surface. In the invention, a low temperature bonding process may be used to bond the wafers. In order to bond silicon surfaces at low temperatures, excess gases such as water vapor, nitrogen, hydrocarbons and hydrogen must be removed from the interface. Bonding results for silicon-to-silicon bonding indicated a strong bond occurred at the edges of the wafers, but was very weak at the center of the wafers. That is, at the center of the wafer, there is no edge effect that can efficiently remove excess gaseous material by outgassing. To overcome this problem, a preferred bonding method uses trenches to remove residual gases from the interface.

As shown in FIG. 2, an alternate preferred embodiment of the invention entails the formation of trenches following CMP of the planarization layer 2. FIG. 4 shows trenches 5 that have been formed in upper surface of the planarization layer 2 over the substrate 1. The trenches may be formed using any appropriate dry or wet etch method. For example, a chemical etch, plasma etch, reactive ion etch (RIE), ion sputtering or electron beam etching can be used. The trenches, once formed, provides voids in the interior of the device into which outgassing can occur. For example, the conversion of Si—OH bonds into Si—O—Si bonds during the later annealing step will result in the release of oxygen. Hydrogen and residual hydrocarbons may also be present. The trenches provide a void into which the gasses can migrate. If there is no trench structure, then this un-outgassed material contributes to the formation of microvoids that have a deleterious effect on the adhesion of the planarization layer 2 to the single crystalline layer 3. The trenches may also be formed in the single crystalline layer 3. In the embodiment of the invention shown in FIG. 2, trenches are patterned in the SOI layer prior to surface preparation. Additionally, trenches can be formed in both the planarization layer 2 and the single crystalline layer 3.

The pitch (spacing) of the trenches is not restricted, but a range of about 1500 to 1700 μm is preferred, based upon a 6 inch wafer pressed at 200 lb. The preferred trench depth is about 250 Å. The trenches may preferably have a width of about 1 μm near the reticle and slightly wider (about 5 μm) within the reticle.

The Trenches may be formed either in the planarization (bonding) layer 2 or the single crystalline layer 3, or in both the planarization layer 2 and the single crystalline layer 3. The trenches may be parallel or formed at angles from one another. The trenches may cross each other at 90° or other angles. The pitch, i.e., spacing of the trenches may vary. The pitch may become shorter (thereby providing more trenches) near the center of the wafer, where reduced adhesion is observed, and the pitch may become longer near the edge of the wafer, where fewer adhesion problems are observed. The trenches can form patterns. When trenches are formed in both the planarization layer 2 and the single crystalline layer 3, the trenches of the different layers may cross each other to form a single void system for outgassing. On the other hand, the trenches of the two layers may be arranged so that they do not interconnect.

FIGS. 5a and 5b show sonoscan images of the effect of adding trenches. Initially without trenches (not show), a large area in the center of the wafer would be weakly bonded, therefore preventing further processing. As trenches were added around the reticles, instead of a large weak area in the center of the wafer, microvoids would form in the center of the reticles, as seen in FIG. 5a. The inset of FIG. 5a shows that an exclusion zone was forming around the trenches, in which the gases could escape from the interface. The distance of this zone was measured to be 1500-1700 μm. FIG. 5b, shows a bonded substrate in which the trenches were placed at 1500-1700 μm, except in the test pattern areas, which still showed the microvoids. The large circle in the center of the wafer is a non-bonded region. The bonding process therefore utilizes this trench structure to facilitate the removal of gases from the interface.

Once the trenches have been formed in either wafer or both wafers, the wafers are ready for bonding. The wafers are processed through a series of cleans, i.e., cleaning processes, that consist of a wet chemical clean, plasma clean, and de-ionized water rinse. The purpose of the chemical clean is to remove any particulates, hydrocarbons, or metallic contaminates from the surface. One specific clean consists of an ammonium hydroxide/peroxide, hydrochloric acid/peroxide, and a sulfuric acid/peroxide clean. However, the cleaning process is not restricted to the aforesaid cleaning solvents, and any appropriate cleaning solvents and sequences may be used. However, eliminating sulfuric acid/peroxide was sometimes met with inconsistent results.

The wafers may be then immediately placed in an oxygen plasma to remove any residual hydrocarbons resulting from the chemical clean. This has been found to been one of the important process steps, since the chemicals used in the chemical clean may attack the carriers, resulting in re-deposition of hydrocarbons.

Once the wafers have been processed through the oxygen plasma, the wafers are rinsed with de-ionized water. This step is used to re-form the hydroxide groups on the wafer surface that are necessary to create the initial hydrogen bonds. The wafers are spun dry and then immediately aligned and bonded. The bonding process utilizes vacuum and tool pressure in order to initiate bonding.

Bonding of the two surfaces, i.e., of the planarization layer 2 and the single crystalline layer 3 is through aligning in a system at a temperature that is usually slightly above room temperature. The wafer may then be brought into contact in the aligner, or transported to a bonding chamber where a vacuum may be present. Although bonding under a vacuum is preferred, bonding may also be performed under air or an inert gas at atmospheric pressure. Bonding may also be performed at elevated pressures and temperatures. Bonding is typically performed at 50° C. but could be performed at higher temperatures.

Figure 6:
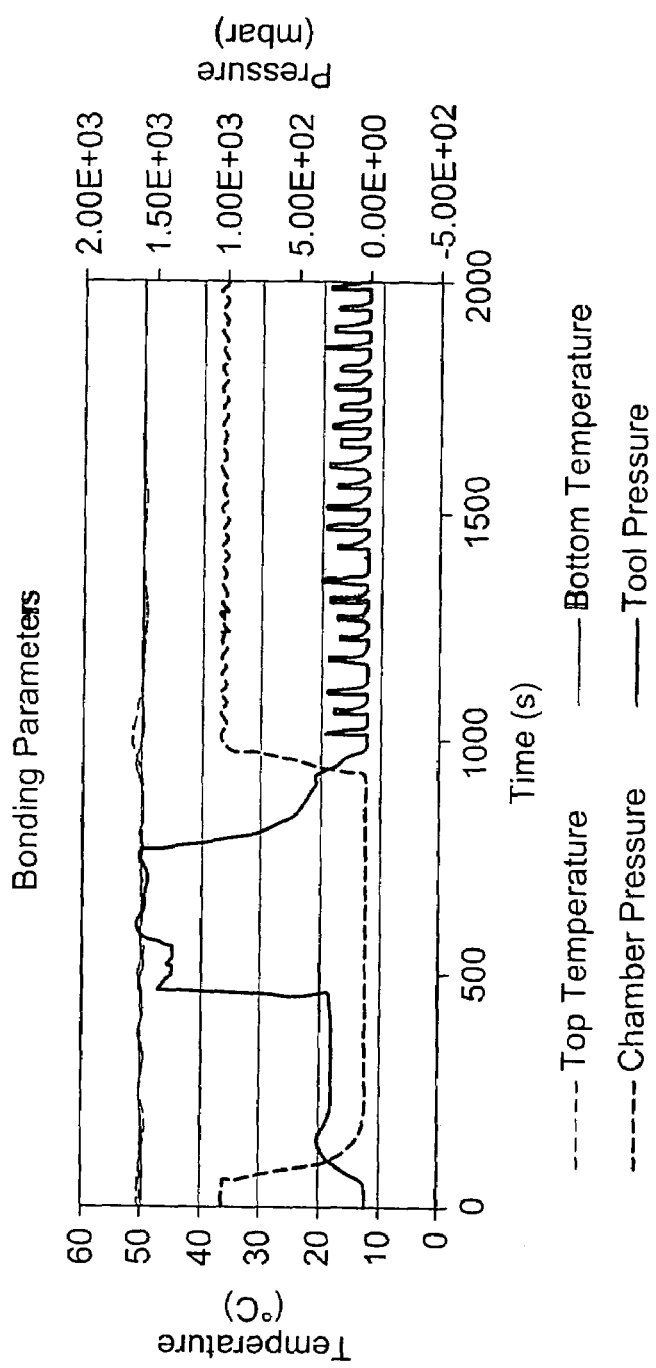
FIG. 6 shows an exemplary bonding profile in accordance with an embodiment of the invention.

A sample profile is shown in FIG. 6 highlighting the top and bottom plate temperatures, chamber pressure and tool pressure. The total bonding time for this profile was approximately 15 minutes (90° sec). The temperatures at both the top and bottom of the chamber were kept constant at about 50° C. The bonding pressure, i.e., mechanical contact pressure, went up to about $1.5 \times 10^3$ mbar during the bonding process, and then reduced to about zero at the end of the bonding process. The chamber pressure approached $1 \times 10^{-4}$ mbar during the bonding process, but leveled off at $1 \times 10^3$ mbar (about atmospheric pressure) after the bonding was complete.

After a sonoscan confirms the absence of voids, the wafer pair advances to annealing. This annealing step provides the energy necessary to diffuse away the hydrogen and to create the Si—O—Si covalent bonds. Determining an acceptable temperature range helpful in this step because a temperature that is too low would result in a weak bond that may fail during later processing steps. A slow ramp (e.g., about 25° C./hour) was used in order to minimize the effect of the thermal expansion mismatch. However, other temperature ramps can be used.

Annealing temperatures can be about 175° C. for a 4 inch wafer. However, annealing temperatures as high as 1150° C. can be used. Typical annealing conditions are 175° C. for 24-100 hours. Annealing may be performed with or without vacuum.

In order to complete the transfer, the handle wafer of the SOI may be thinned. Typically, this process begins with a bulk removal process. Grinding, lapping and chemical etches are examples of bulk removal processes that could be used. Bulk removal was demonstrated using grinding. If a bulk wafer is used, the wafer pair may either be chemically thinned or lapped in order to remove more material, or may be polished using chemical mechanical planarization (CMP).

For SOI wafers, bulk removal should stop prior to reaching the oxide to allow for a slower removal process, such as a chemical etch that has high silicon to oxide selectivity. The selective etch should continue until the oxide is exposed at which point the etching is stopped. The oxide layer can be removed using a wet etch, leaving only the device layer of the SOI, resulting in a successful layer transfer. Finally, the wafers can be annealed at high temperatures. This high temperature annealing decomposes the Si—O—Si bonds and form Si—Si bonds.

Also, the material of the single crystalline layer 30 is not restricted to Si, and other materials can be used, such as MgO, SiC, InP, GaSb, GaAs, CaF$_2$, AlN, GaN and combinations thereof.

The multi-layer substrate described has a high thermal efficiency combined with a single crystalline layer of semiconductor (which may be silicon) suitable as the foundation for forming a semiconductor device. This unique construction makes possible technologies were both efficient switching and high power amplification and be integrated on a single chip. That is, the high thermal efficiency allows the heat generated by a high-powered amplifier to be readily conducted away from the semiconductor through the substrate. Additionally, the single crystalline semiconductor layer can be used to form a high speed switching circuit. In the related art, these two functions necessitated the utilization of separate chips that then needed to be bonded together. However, a composite substrate that combines thermal efficiency with the appropriate single crystalline semiconductor can be used to overcome the disadvantages of the related art.

The multilayered substrate described above represents an embodiment of the invention that has a wide range of applications. These applications can be found wherever there is a desire for fast switching CMOS technology in environments that require high thermal efficiency. One preferred application is described below, where the multilayered substrate may be used as the basis of a technology that can combine a fast switching CMOS circuits with a power amplifier on the same circuit. However, the multilayer substrate is not restricted to the application described below. Also, the semiconductor device described below in not restricted to being manufactured on the substrate described above.

FIGS. 7 through 15 illustrate the steps of manufacturing a semiconductor device in accordance with a preferred embodiment of the invention. The steps shown in FIGS. 7 through 15 need not be practiced in the order shown, and any appropriate sequence of process steps can be used. Additional process steps can also be used between the steps shown in FIGS. 7-15.

Figure 7:
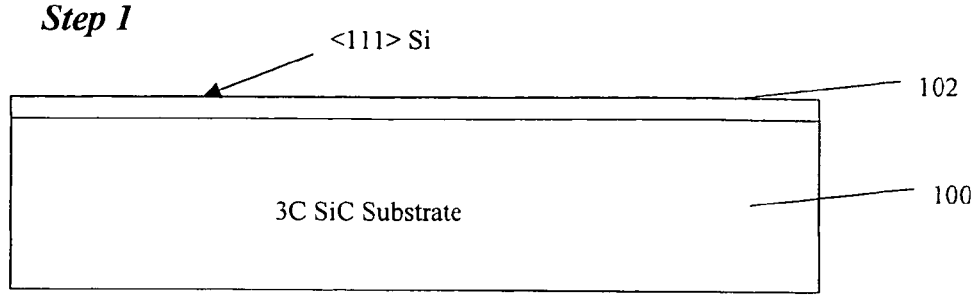
FIG. 7 shows a process step of manufacturing a semiconductor device in accordance with a preferred embodiment of the invention.

FIG. 7 (Step 1) shows providing a "composite substrate" or "engineered substrate" that has the characteristics of high thermal conductivity and a single crystalline surface. Typically, a high thermal conductivity substrate 100 is used, over which is formed a single crystalline layer 102. The substrate may be SiC, preferably 3C SiC. However other materials can be used for the substrate, including graphite, diamond, AlN, ZnSe, BN, and mixtures thereof. The single crystalline layer 102 may be formed from Si or any other appropriate semiconductor material. The substrate 100 may be either amorphous, single crystalline or polycrystalline. In a preferred embodiment of the invention a polycrystalline 3C SiC substrate is used, over which a <111> Si layer is formed. Preferably, the substrate as shown in FIGS. 1-6, 16 and 17 and described above may be used. However, the circuit is not restricted to being formed the substrate shown in FIGS. 1-6, 16 and 17 and described above, and any appropriate substrate can be used. On the other hand, the high thermal efficiency of the multilayer substrate described above synergistically enhances the performance of the semiconductor device shown in FIGS. 1 through 15.

Figure 8:
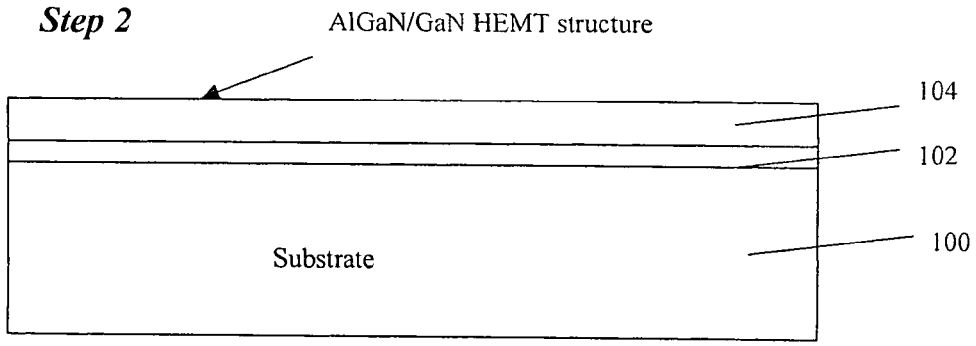
FIG. 8 shows a process step of manufacturing a semiconductor device in accordance with a preferred embodiment of the invention.

In FIG. 8 (Step 2), a high electron mobility transistor (HEMT) layer 104 is formed over the single crystalline layer 102. High Electron Mobility Transistors (HEMT's) find their use in microwave circuit applications. The transistor behaves much like conventional Field Effect Transistors (FET's). A conducting channel between the drain and source electrodes can be affected by applying a voltage to the Gate electrode. This causes modulation of the drain-source current. In an HEMT, the conducting channel is created by a hetero structure, which confines the charge carriers to a thin layer. The concentration of the carriers and their speed in this layer enables the transistor to maintain a high gain at very high frequencies.

The HEMT structure 104 can be formed from AlGaN/GaN using chemical vapor deposition (CVD), molecular beam epitaxy (MBE) or organometallic molecular vapor phase epitaxy (OMVPE). AlGaN/GaN materials have high transconductance (which helps linearity), good thermal management and high cutoff frequencies. The HEMT structure can be grown using CVD or metal organic CVD (MOCVD). Other CVD methods include atmospheric pressure CVD (APCVD), low pressure CVD (LPCVD), plasma enhanced CVD (PECVD), MBE and OMVPE.

Figure 9:
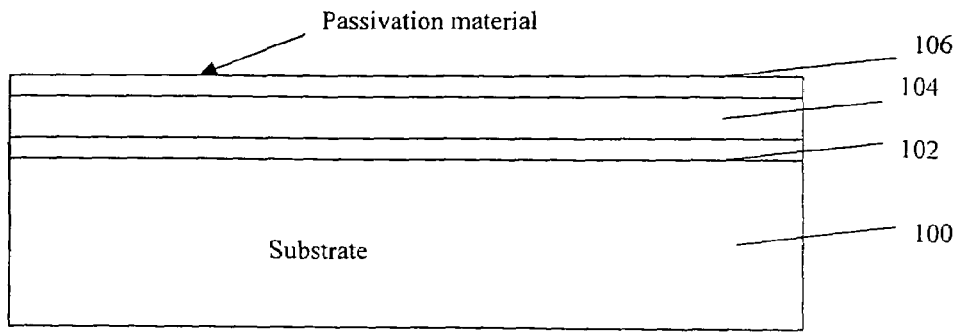
FIG. 9 shows a process step of manufacturing a semiconductor device in accordance with a preferred embodiment of the invention.

FIG. 9 (Step 3) shows a passivation layer 106 that is formed to encapsulate the HEMT layer. The passivation layer can be a nitride such as SiNx or an oxide such as SiOx. Also, the passivation layer 106 can an organic material such as benzocyclobutene (BCB). The passivation layer can be formed using CVD methods, including PECVD or LPCVD.

Figure 10:
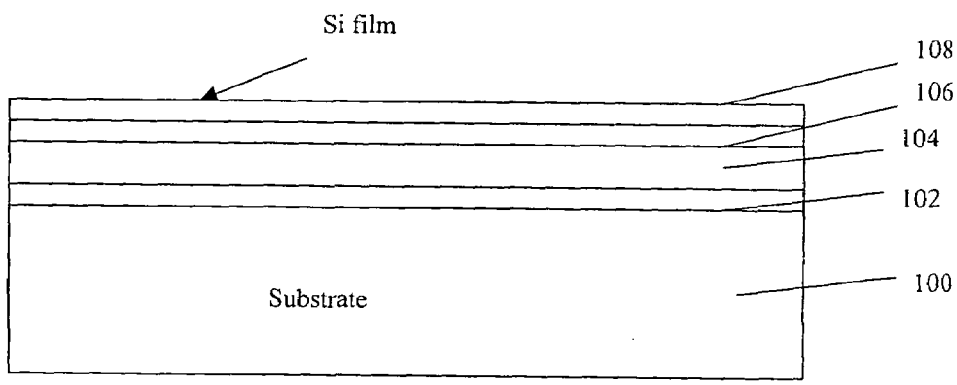
FIG. 10 shows a process step of manufacturing a semiconductor device in accordance with a preferred embodiment of the invention.

In FIG. 10 (Step 4) a wafer bonding step bonds a single crystalline film 108 to the passivation layer 106. Although any suitable single crystalline material can be used, a <100> Si layer is used as the exemplary material. The single crystalline layer 108 is mechanically applied to the passivation layer 106 using a wafer bonding process. The parameters of a wafer bonding process, using SOI that is later thinned, has been described above.

Figure 11:
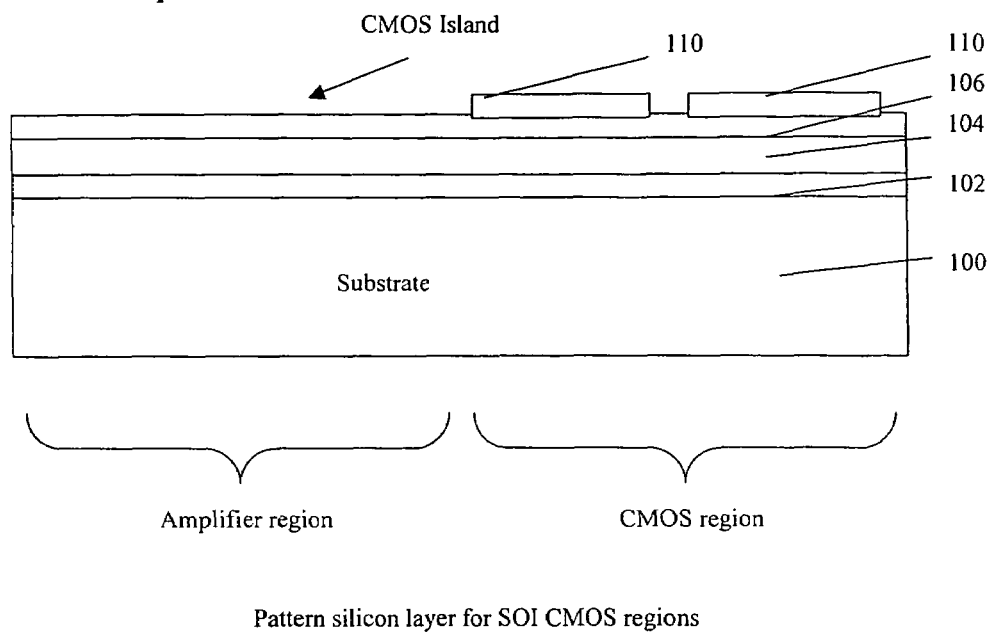
FIG. 11 shows a process step of manufacturing a semiconductor device in accordance with a preferred embodiment of the invention.

In FIG. 11 (Step 5) complementary metal oxide semiconductor (CMOS) devices are defined. This is accomplished by forming an oxide layer, then eliminating the oxide layer where the CMOS devices are to be formed. In this step, conventional photolithographic methods can be used, including the use of masks, photoresists and wet or dry etch methods. After, etching, islands 110 are defined that will contain the CMOS structure. Preferably, when the layer 108 is <100> silicon, the islands 110 are then <100> SOI CMOS islands. This step also divides the semiconductor device into an area having islands 110 that will contain the silicon-based CMOS circuits, and into an area where the islands 110 are not present which will bear the AlGaN/GaN amplifiers.

Figure 12:
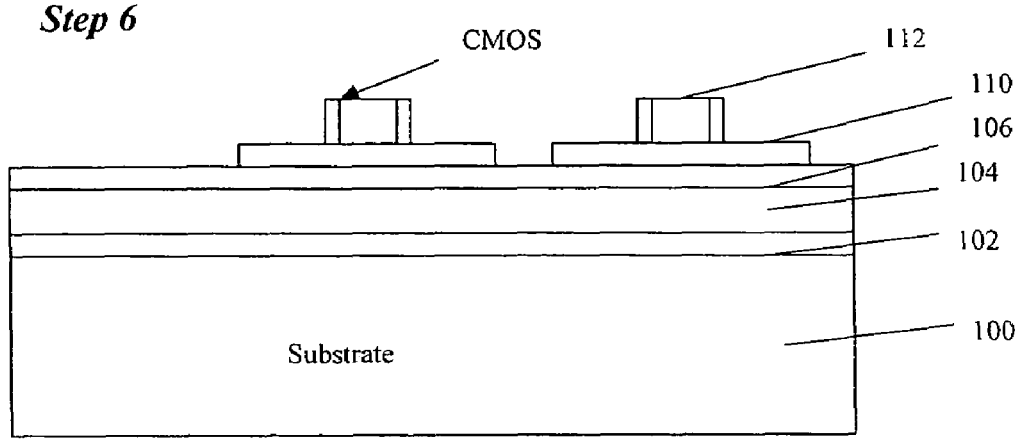
FIG. 12 shows a process step of manufacturing a semiconductor device in accordance with a preferred embodiment of the invention.

FIG. 12 (Step 6) shows the formation at least one CMOS FET having a source/gate/drain structure 112 over at least one of the CMOS islands 110. This FET structure 112 can be referred to an SOI CMOS FET. These FET(s) can be formed using semiconductor manufacturing technology known to the art. This may included the use of masks, photoresists, CVD, sputtering, UV lithography, e-beam lithography, wet and dry etches, etc.

An alternate route to wafer bonding or forming the CMOS circuit structure is based on the "smart-cut" technique. The smart-cut technique entails the implantation of H$^+$ or He$^+$ onto an oxide coated Si wafer. The implanted ions introduce micro-cavities that will cause the silicon wafer to split along the peak concentration zone when subjected to high temperature annealing. That is, after the ion-implanted wafer is bond with a second wafer, a high temperature anneal will cause the ion-implanted wafer to split to leave an exposed single crystalline silicon layer ready for further processing. A typical smart-cut fabrication process is described by J. Du et al., Sensors and Actuators A, 112 (2004), p. 116-121.

Figure 13:
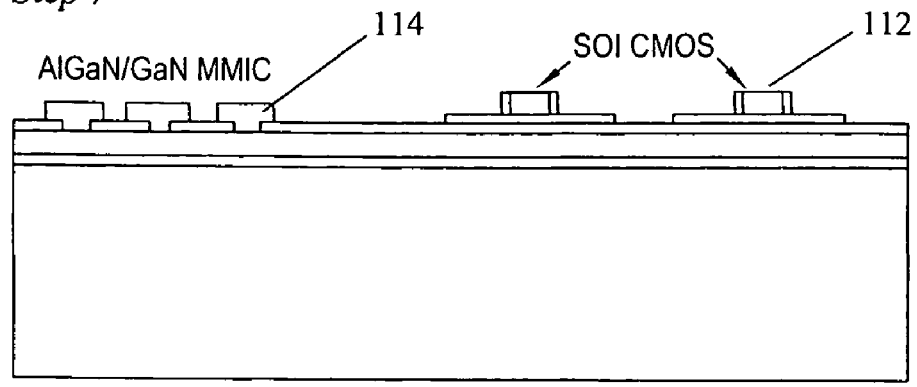
FIG. 13 shows a process step of manufacturing a semiconductor device in accordance with a preferred embodiment of the invention.

FIG. 13 (Step 7) shows the formation of the AlGaN/GaN high electron mobility transistors (HEMTs) 114 suitable for high power applications. In a preferred embodiment of the invention, the HEMTs 114 may form a monolithic microwave integrated circuit. The HEMTs are formed over the passivation layer 106 and contact the AlGaN/GaN layer 104. That is, the novel structure of the inventive semiconductor device allows, on one chip, the formation of a CMOS circuit side-by-side with an AlGaN/GaN MMIC.

The formation of the AlGaN/GaN HEMTs may be accomplished by various methods. For example, AlN, GaN and AlGaN films may be grown via gas source molecular beam epitaxy (GSMBE) using ammonia, as is described by G. Kipshidze et al. J. Electronic materials, Vol. 30, No. 7 (2001), p. 825.

Figure 14:
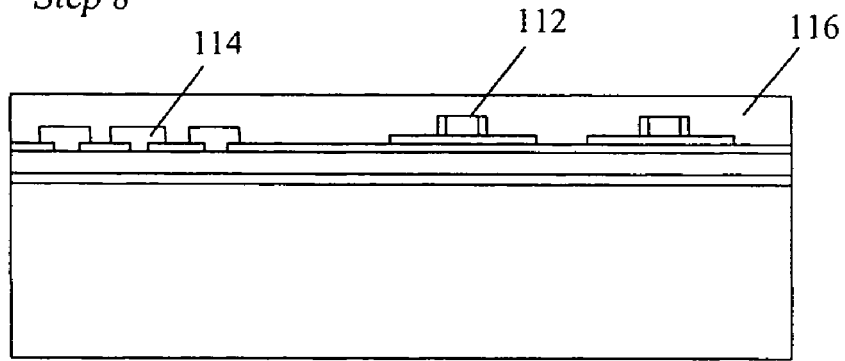
FIG. 14 shows a process step of manufacturing a semiconductor device in accordance with a preferred embodiment of the invention.

FIG. 14 (Step 8) shows the formation of insulator layer 116 over both the CMOS and HEMT transistors, covering the entire surface of the semiconductor device. The insulator 116 may be composed of an interlayer dielectric (ILD) that is an insulating material suitable for separating metal layers. After formation of the insulator layer 126, it may be polished using conventional methods such as CMP or mechanical polishing.

Figure 15:
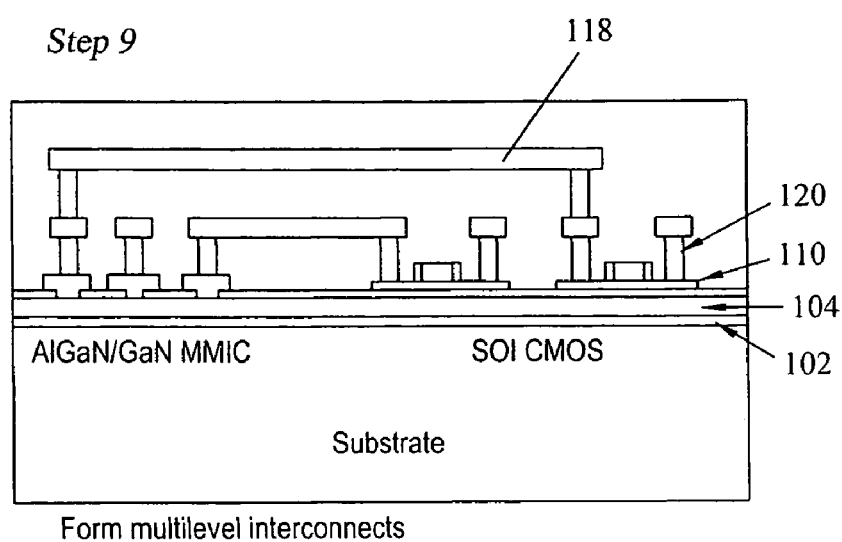
FIG. 15 shows a process step of manufacturing a semiconductor device in accordance with a preferred embodiment of the invention.

FIG. 15 (Step 9) shows the formation of the final circuit using interconnects 118 and plugs 120. The material of the interconnects 118 can be, but are not restricted to, aluminum, aluminum-copper alloys, and copper. The plugs 120 are typically formed from tungsten or tungsten alloys. A description of the technology used for interconnecting can be found in M. Quirk et al., *Semiconductor Manufacturing Technology*, Prentice Hall (2001), Chapter 12: Metallization.

EXAMPLES

Two examples demonstrate the successful transfer of silicon to silicon carbide: (1) a silicon layer from a bulk silicon wafer to silicon carbide, and (2) a silicon layer from SOI to silicon carbide. Sonoscan images of the two are shown in FIGS. 16a and 16b. Bulk silicon, which is shown in FIG. 16a, was used for the first attempt in order to test the bonding process using the polished polycrystalline silicon carbide wafers. The center region shows small voids that can be attributed the planarization of the silicon layer. This particular set of wafers was thinned to approximately 100 μm.

The second example of bonding entailed bonding an SOI wafer to polycrystalline silicon carbide. The sonoscan in FIG. 16b shows a uniform bond without voids. This wafer was annealed at 175° C. and thinned to the buried oxide layer. FIG. 17 shows a cross-section of the wafer pair shown in FIG. 16b. In FIG. 17, several layers can be distinguished: the polycrystalline silicon carbide substrate, the silicon planarization layer, single crystal silicon layer, and the buried oxide.

As a result, clear advantages have been demonstrated over the conventional art devices, which have poor thermal conductivities arising from the utilization of oxide bonding layers. A single crystalline semiconductor (Si) bonds to a thermally conductive substrate (such as SiC) in a simple and cost effect manner to achieve a multilayer device that has both the electrical properties and thermal properties necessary for high voltage semiconductor devices.

High-speed silicon CMOS circuits and high-power AlGaN/GaN amplifiers are also integrated on the same wafer. The high thermal conductivity and high resistivity of polycrystalline silicon carbide substrates are advantageous for the fabrication of high power and high frequency devices are fabricated. For example, a thin layer of high resistivity <111> silicon may be bonded on a polycrystalline-SiC substrate. Following the bonding, an AlGaN/GaN structure may be grown over the bonded silicon layer. A silicon nitride or a silicon oxide layer is then deposited over the AlGaN/GaN structure. Following this, a thin layer of <100> silicon may be bonded to the silicon nitride/silicon oxide layer. The area for the fabrication of AlGaN/GaN devices is defined, and the <100> silicon is etched away from those areas. Following this, CMOS devices are fabricated on the silicon layer and AlGaN/GaN devices fabricated on the AlGaN/GaN surface. Finally, the wafer is planarized and multilevel interconnects formed.

It will be apparent to those skilled in the art that various modifications and variations can be made in the semiconductor device using dual light units of the invention without departing from the spirit or scope of the invention. Thus, it is intended that the invention covers the modifications and variations of this invention provided they come within the scope of the appended claims and their equivalents.

What is claimed is:

1. A semiconductor device, comprising:
   a substrate, the substrate having a single crystalline layer;
   an ALGaN/GaN layer formed over the single crystalline layer;
   a passivation layer formed over the ALGaN/GaN layer;
   a CMOS region having at least one single crystalline island formed over the passivation layer;
   at least one FET formed over the at least one single crystalline island; and
   an amplifier region having at least one AlGaN/GaN transistor.

2. The semiconductor device of claim 1, wherein the single crystalline layer comprises <111> silicon.

3. The semiconductor device of claim 1, wherein each single crystalline island comprises <100> silicon.

4. The semiconductor device of claim 1, wherein the passivation layer comprises at least one of a nitride or an oxide.

5. The semiconductor device of claim 1, wherein at the least one FET and the at least one AlGaN/GaN transistor is connected with metal interconnects and plugs.

6. The semiconductor device of claim 5, wherein the interconnects are formed from aluminum, aluminum-copper alloys, or copper.

7. The semiconductor device of claim 5, wherein the plugs are formed from tungsten.

8. The semiconductor device of claim 1, wherein the AlGaN/GaN transistor(s) comprise a monolithic microwave integrated circuit.

9. The semiconductor device of claim 1, wherein the substrate comprises:
   a bottom substrate, the bottom substrate having a polished surface;
   a planarization layer formed over the polished surface of the bottom substrate; and
   the single crystalline layer bonded to the planarization layer.

10. The semiconductor device of claim 9, wherein the polished surface has a root-mean-square surface roughness of 10 nm or less.

11. The semiconductor device of claim 9, wherein at least one trench is formed in at least one of the planarization layer or the single crystalline layer.

12. The semiconductor device of claim 11, wherein the trenches have a pitch up to 2000 pm apart.

13. The semiconductor device of claim 11, wherein the trenches have a pitch of about 1500-1700 pm.

14. The semiconductor device of claim 9, wherein the bottom substrate comprises an amorphous, a single crystalline or a polycrystalline material selected from the group consisting of Sic, graphite, diamond, AlN, ZnSe, BN, GaN and mixtures thereof.

15. The semiconductor device of claim 9, wherein the bottom substrate comprises polycrystalline Sic.

16. A method for manufacturing a semiconductor device, comprising:
    providing a substrate, the substrate having a single crystalline layer;
    forming an AlGaN/GaN layer over the single crystalline layer;
    forming a passivation layer formed over the AlGaN/GaN layer;
    forming a CMOS region having at least one single crystalline island over the passivation layer;
    forming a at least one FET over at least one single crystalline island; and
    forming an amplifier region having at least one AlGaN/GaN transistor.

17. The method of claim 16, wherein the single crystalline layer comprises <111> silicon, each single crystalline island comprises <100> silicon, and the passivation layer comprises a nitride and/or an oxide.

18. The method of claim 16, wherein the engineered substrate is formed by:
    providing a bottom substrate;
    polishing a surface the bottom substrate;
    forming a planarization layer over the polished surface of the bottom substrate; and
    bonding the single crystalline layer formed over the planarization layer.

19. The method of claim 16, which further comprises:
    forming at least one trench in at least one of the planarization layer or the single crystalline layer, before the step of bonding the single crystalline layer to the planarization layer.

20. The method of claim 18, wherein the polished surface has a root-mean-square surface roughness of 10 nm or less.

* * * * *